(12) United States Patent (10) Patent No.: US 7,102,415 B1
Potanin et al. (45) Date of Patent: Sep. 5, 2006

(54) TRIP-POINT DETECTION CIRCUIT

(75) Inventors: Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/810,120

(22) Filed: Mar. 26, 2004

(51) Int. Cl.
*H03K 17/687* (2006.01)

(52) U.S. Cl. ............... 327/427; 327/434; 320/162; 320/164; 320/165; 323/284

(58) Field of Classification Search ............... 320/148, 320/149, 157, 158, 159, 161, 162, 163, 164; 323/271, 274, 275, 277, 282, 284, 285; 327/62, 327/538, 543
See application file for complete search history.

(56) References Cited

U.S. PATENT DOCUMENTS

| | | | | |
|---|---|---|---|---|
| 5,844,398 A | | 12/1998 | Kwan et al. | ............... 320/31 |
| 5,900,717 A | * | 5/1999 | Lee | ............... 320/150 |
| 5,939,862 A | * | 8/1999 | Kates et al. | ............... 320/125 |
| 5,961,730 A | * | 10/1999 | Salmonsen et al. | ............... 134/4 |
| 5,986,437 A | * | 11/1999 | Lee | ............... 320/162 |
| 5,994,875 A | * | 11/1999 | Lee | ............... 320/132 |
| 6,384,666 B1 | | 5/2002 | Bertin et al. | ............... 327/525 |
| 6,456,051 B1 | * | 9/2002 | Darzy | ............... 323/284 |

FOREIGN PATENT DOCUMENTS

JP  5-336679  * 12/1993

* cited by examiner

*Primary Examiner*—Tuan T. Lam
(74) *Attorney, Agent, or Firm*—Brett A. Hertzberg; Merchant & Gould PC

(57) ABSTRACT

A current is provided from a power source to a load through a pass circuit that is series coupled to a sense resistor. A current trip-point detection circuit is arranged to detect a change in the current that is provided to a load. The current trip-point detection circuit includes at least two resistors that are series coupled from the sense resistor to a current source. A comparator compares a sense voltage to a tap-point between the two resistors such that the comparator asserts a trip-point detection signal when the current to the load reaches a predetermined threshold. The sense voltage can correspond to the voltage across the load or some other voltage that is proportional to the voltage across the load. The circuit arrangement has a simplified design that sets the trip-point as a percentage of the maximum output current. The current level trip-point can be temperature compensated.

21 Claims, 6 Drawing Sheets

TRIP-POINT DETECTION CIRCUIT

FIELD OF THE INVENTION

The present invention is related to detection circuits. In particular, the present invention is related to a detection circuit that monitors an output current that is delivered to a load and asserts a trip-point detection signal when the output current changes to a pre-determined threshold level.

BACKGROUND OF THE INVENTION

Demand for portable electronic devices is increasing each year. Example portable electronic devices include: laptop computers, personal data assistants (PDAs), cellular telephones, and electronic pagers. Portable electronic devices place high importance on total weight, size, and battery life for the devices.

Most portable electronic devices employ rechargeable batteries. Commonly used rechargeable batteries include Nickel-Cadmium (NiCad), Nickel-Metal-Hydride (NiMHi), Lithium-Ion (Li-Ion), and Lithium-Polymer based technologies. Charger circuits are commonly available for each of these types of battery technologies.

Example battery charger circuits typically have two operating modes: a constant current mode, and a constant voltage mode. In the constant current mode, a charging current (I) is delivered to the battery (or load) via a regulator that maintains a regulated charging current. As the voltage level of the battery approaches the desired final voltage, the circuit switches to a constant voltage operating mode. In the constant voltage mode, the output voltage is regulated while a trip-point detection circuit monitors the charging current that is delivered to the battery. The trip-point detection circuit initiates a trip point signal when the charging current indicates that the battery has reached a fully charged state (e.g., 10% of the maximum charging current in the constant voltage mode).

FIG. 6 is an illustration of a conventional trip-point detection circuit (600). Trip-point detection circuit 600 includes two amplifiers (AMP1, AMP2), a comparator (CMP), three resistors (R601, R601, and RSNS), a resistor ladder, and a transistor (MP). Amplifier AMP1 evaluates the voltage drop across resistors RSNS and R601, and includes a trim adjustment control (TRIM) for adjusting the offset in the amplifier. Transistor MP is responsive to the output of amplifier AMP1 such that the current through resistor R602 is responsive to changes in the output current level (IOUT). Amplifier AMP2 receives a reference voltage (VREF) and is arranged in a feedback loop with the resistor ladder to provide an adjustable comparison level (VTRIP). The resistor ladder is configured with trimming adjustments (TRIM LEVEL) to accommodate for process related inaccuracies in the ladder network, as well as a trip level selection (TRIP LEVEL) to change the comparison level (VTRIP). Comparator CMP compares VTRIP to the voltage across resistor R602, which is related to the output current level (IOUT), and asserts the trip signal when the output current level drops below a predetermined level set by VTRIP.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
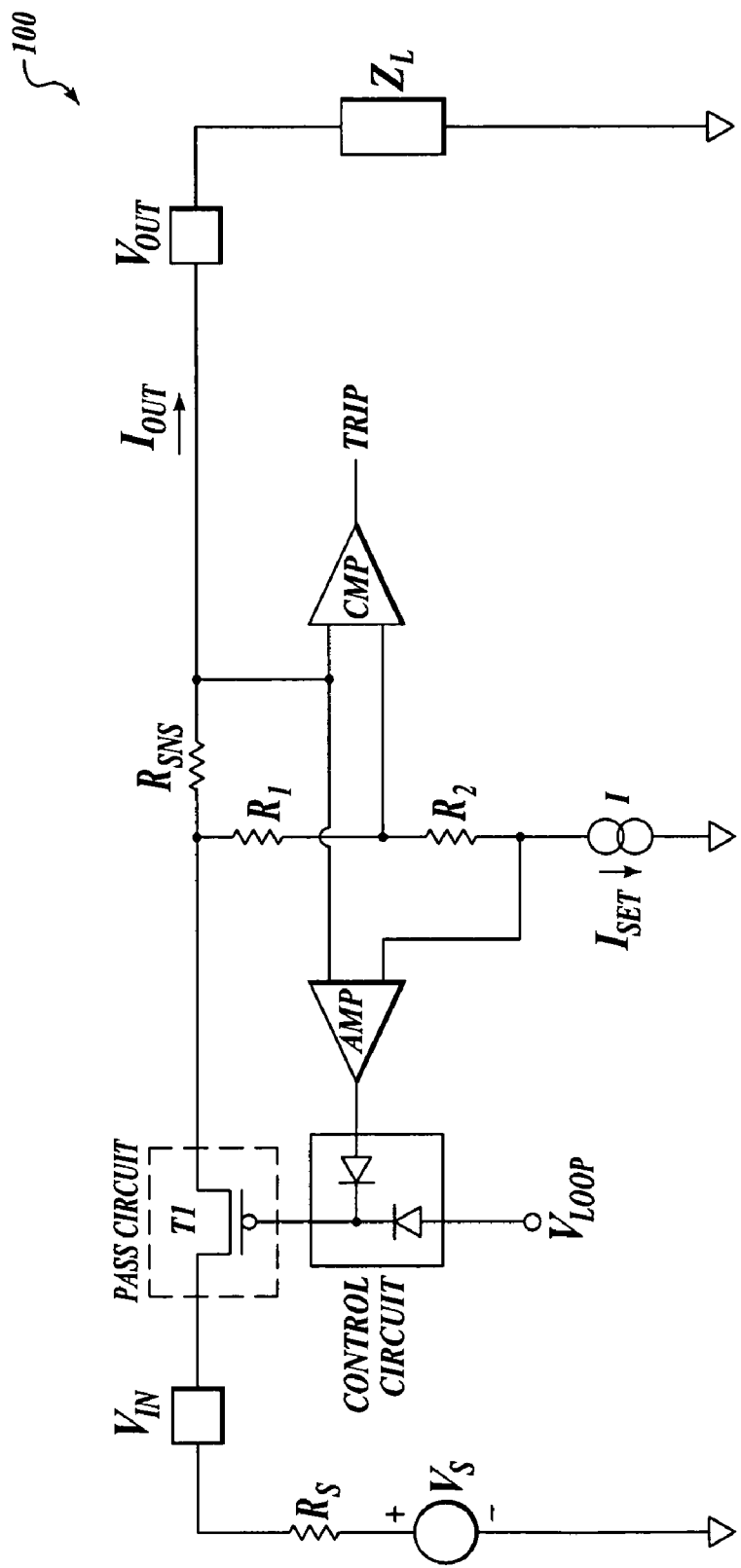
FIG. 1 is a schematic illustration of an example embodiment of a trip-point detection circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a system, method, and apparatus for detecting a trip-point in an output current. Current is coupled from a power source to a load through a pass circuit that is series coupled to a sense resistor. A current trip-point detection circuit is arranged to detect a change in the current that is provided to a load. The current trip-point detection circuit includes at least two resistors that are series coupled from the sense resistor to a current source. A comparator compares a sense voltage to a tap-point between the two resistors such that the comparator asserts a trip-point detection signal when the current to the load reaches a predetermined threshold. The sense voltage can correspond to the voltage across the load or some other voltage that is proportional to the voltage across the load. The circuit arrangement has a simplified design that sets the trip-point as a percentage of the maximum output current. The current level trip-point can be temperature compensated.

The circuits described herein are applicable to secondary power supplies, current sources and battery chargers. Each circuit is arranged to detect a state where the load current becomes higher or lower than a predetermined threshold level. The predetermined threshold may correspond to a portion (or percentage) of a current limit.

In one example, the current trip-point circuit is provided in a battery charger application. Energy is provided from a power source to a load through a power pass device and a sense resistor. The power pass device and additional circuitry are arranged to regulate power that is delivered to the load. A current regulation loop is provided such that the current delivered to the load is controlled and limited. A current trip-point detection circuit monitors the output current to the load and determines when the output current begins to decrease below a predetermined threshold level where the load (e.g., a rechargeable battery) is determined to be fully charged (e.g., 10% of the maximum charging current).

FIG. 1 is a schematic illustration of an example embodiment of a trip-point detection circuit (100) that is arranged according to an aspect of the present invention. Trip-point detection circuit 100 includes a pass circuit, a control circuit, three resistors (R1, R2 and RSNS), an amplifier circuit (AMP), a comparator circuit (CMP), and a current source (I).

In operation, an input voltage (VIN) is provided to an input port from a voltage source (VS) that has an associated source resistance (RS). A load circuit (e.g. ZL) is coupled to an output port. A current (IOUT) is delivered to the load circuit from the output port such that a voltage (VOUT) develops across the load circuit. The pass circuit is arranged to control the flow of current from the input port to an output port in response to a control signal (CTL). The control circuit is arranged to adjust the control signal (CTL) for operation in constant current and constant voltage operating modes.

Resistors R1 and R2 are arranged to cooperate with current source I to generate a regulation level (VREG) that is given by: VREG=VX−ISET*(R1+R2), where ISET is a current level associated with current source I. Resistor RSNS is arranged to provide a sense level (VSNS) that is responsive to the output current (IOUT) provided to load, as given by: VSNS=VX−IOUT*RSNS. The regulation level (VREG) and the sense levels (VSNS) are utilized by the trip-point detection circuit inside of the voltage and current control loops.

Amplifier circuit AMP is arranged to cooperate with the control circuit to provide regulation of the output current (IOUT) when the circuit is operated in a constant current mode. The current flowing through resistor RSNS is regulated such that the voltage drop across resistor RSNS is equal to the voltage drop across resistors R1 and R2. In other words, VREG=VSNS during the current limit mode of the circuit such that: IOUT*RSNS=ISET*(R1+R2).

The pass circuit has an internal resistance (e.g., the conductance associated with a MOS-type field-effect transistor) such that the output current (IOUT) is limited to a maximum value (IMAX). The output voltage (VOUT) increases as current IOUT is delivered to the load. Once the output voltage (VOUT) increases above a predetermined threshold, the circuit is operated in a constant voltage mode, where the amount of output current that is required will gradually decrease as the desired output voltage is achieved.

A trip point voltage (VTRIP) is provided by resistor R1 and current source I such that VTRIP=VX−ISET*R1. Comparator circuit CMP is arranged to compare the sense voltage (VSNS) to a trip voltage (VTRIP), such that the comparator circuit initiates a detection signal (TRIP) when VTRIP=VSNS.

As the load current (output current IOUT) decreases from the maximum current limit, the voltage drop (VSNS) across the sense resistor (RSNS) will begin to decrease. However, the voltage drop across resistors R1 and R2 remains relatively constant since current source I is arranged to provide a relatively constant current (ISET). As the output voltage approaches a final voltage level, the output current (IOUT) is decreased by the control loop such that the voltage across RSNS decreases.

When the power regulation circuit operates in current limiting mode, the current flowing through RSNS is equal to preset current limit (IOUT=IMAX). The voltage drop across resistor RSNS is equal to drop across resistor R1 and R2, or IMAX*RSNS=ISET*(R1+R2). In this current limit condition, comparator CMP has a voltage on one of its inputs (e.g., the inverting input) that is higher than the other input (e.g., the non-inverting input) such that the comparator output corresponds to a first logic level (e.g., a low logic level).

After the current limit is reached, the voltage across the load may begin to reach a predetermined voltage such as a final charge voltage (e.g., 4.1V for a Li-Ion battery, 4.2V for a Li-polymer battery) in a battery charger application. In this example, the load current begins to decrease from the maximum current level (IMAX) and voltage drop across resistor RSNS decreases. When the output current reaches a predetermined threshold level (e.g., 5%, 10%, 15%, 20% of IMAX), the voltage drop across resistor RSNS will be equal to the voltage drop across resistor R1. After crossing the predetermined threshold level, the voltage on the first input (e.g., non-inverting input) of comparator CMP becomes higher than the voltage on the second input (e.g., inverting input) of comparator CMP such that the output of comparator CMP changes from the first logic level to the second logic level (e.g., a high logical level). The change in the logic level of the output of the comparator indicates that the output current (IOUT) is lower than a predetermined trip-point.

In some circuits the voltage drop across resistor RSNS is relatively small such that it is necessary to have a very low offset comparator to eliminate errors in the trip-point. In one example, the offset is cancelled with an auto-zero technique. in another example, a high performance low offset comparator is used. Any other appropriate low offset comparator topology may be used as will be further described by the examples illustrated in FIGS. 4 and 5.

The described trip-point detection circuit can be easily modified for obtaining selectable trip point levels. A resistor ladder or series chain of resistors can be used in place of resistors R1 and R2 in conjunction with a multiplexer circuit as will be described further with respect to FIG. 3.

Figure 2:
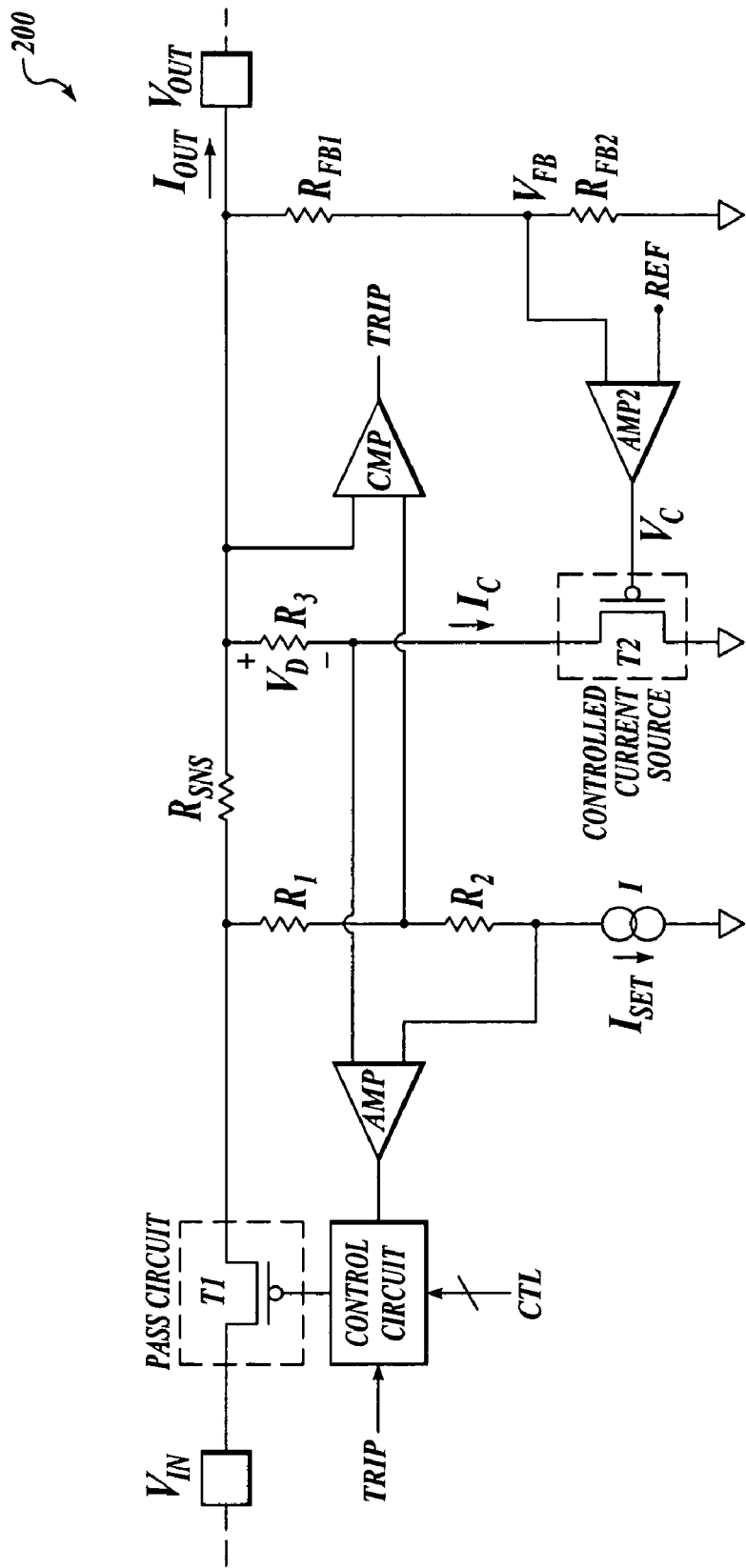
FIG. 2 is a schematic illustration of another example embodiment of a trip-point detection circuit.

FIG. 2 is a schematic illustration of another example embodiment of a trip-point detection circuit (200) that is arranged according to another aspect of the present invention. Trip-point detection circuit 200 includes a pass circuit, a control circuit, five resistors (R1, R2, R3, RSNS, RFB1 and RFB2), two amplifier circuits (AMP, AMP2), a comparator circuit (CMP), a current source (I), and a controlled current source.

Trip-point detection circuit 200 is arranged to operate in a substantially similar manner as trip-point detection circuit 100 from FIG. 1. However, trip-point detection circuit 200 includes the addition of resistor R3, a controlled current source (e.g., transistor T2), another amplifier circuit (AMP2), and resistors RFB1 and RFB2. Also, the control circuit illustrated in FIG. 2 is responsive to one or more control signals (CTL) and a detection signal (TRIP).

Resistors RFB1 and RFB2 are arranged in a voltage divider configuration that provides a feedback voltage (e.g., VFB) that is responsive to the output voltage (VOUT). Amplifier AMP2 compares the feedback voltage (VFB) to a reference voltage (REF) and provides a control signal (e.g., VC). The controlled current source (e.g., a transistor such as T2) provides a controlled current (IC) that is responsive to the control signal (VC).

Resistor R3 is coupled between the output terminal and the controlled current source. Amplifier AMP has an input terminal that is coupled to the output terminal through resistor R3 such that a voltage drop (e.g., VD) is observed between the output voltage (VOUT) and the input of amplifier AMP. Voltage drop VD is determined by the controlled current (IC) and the value associated with resistor R3. Since the controlled current (IC) is determined by the output voltage (VOUT), voltage drop VD is responsive to changes in the output voltage (VOUT) through the controlled current source.

The controlled current source is illustrated as a transistor circuit (T2). However, the controlled current source may be implemented in a plurality of configuration including but not limited to: a cascode current source, a bipolar junction transistor (BJT) circuit, a field-effect transistor (FET) circuit, and a metal-oxide semiconductor (MOS) circuit, as well as any other appropriate controlled current source configuration.

The controlled current source and resistor R3 are arranged to provide a voltage drop (VD) between the output terminal and the input of amplifier AMP. As described earlier, the voltage drop (VD) is responsive to changes in the output voltage. Resistor R3 has a temperature coefficient such that changes in the operating temperature of the circuit (200) will result in changes in the voltage drop (VD). The combined function of resistor R3 and the controlled current source can be replaced with another circuit including but not limited to a constant current source that cooperates with a variable resistance circuit that is responsive to a control signal such as VC.

Since resistors R1 and R2 are arranged to operate as a voltage divider, any temperature variations in the resistance values associated with resistors R1 and R2 do not detrimentally affect the voltage trip-point for comparator CMP. However, resistor RSNS is not part of a divider circuit and may have temperature variations that can result in variations in the current trip-point. In one example, resistor RSNS is implemented as a metallic material that has a positive temperature coefficient, while resistors R1–R3 may implemented in a non-metallic material (e.g., poly-silicon) with a different temperature coefficient.

Figure 3:
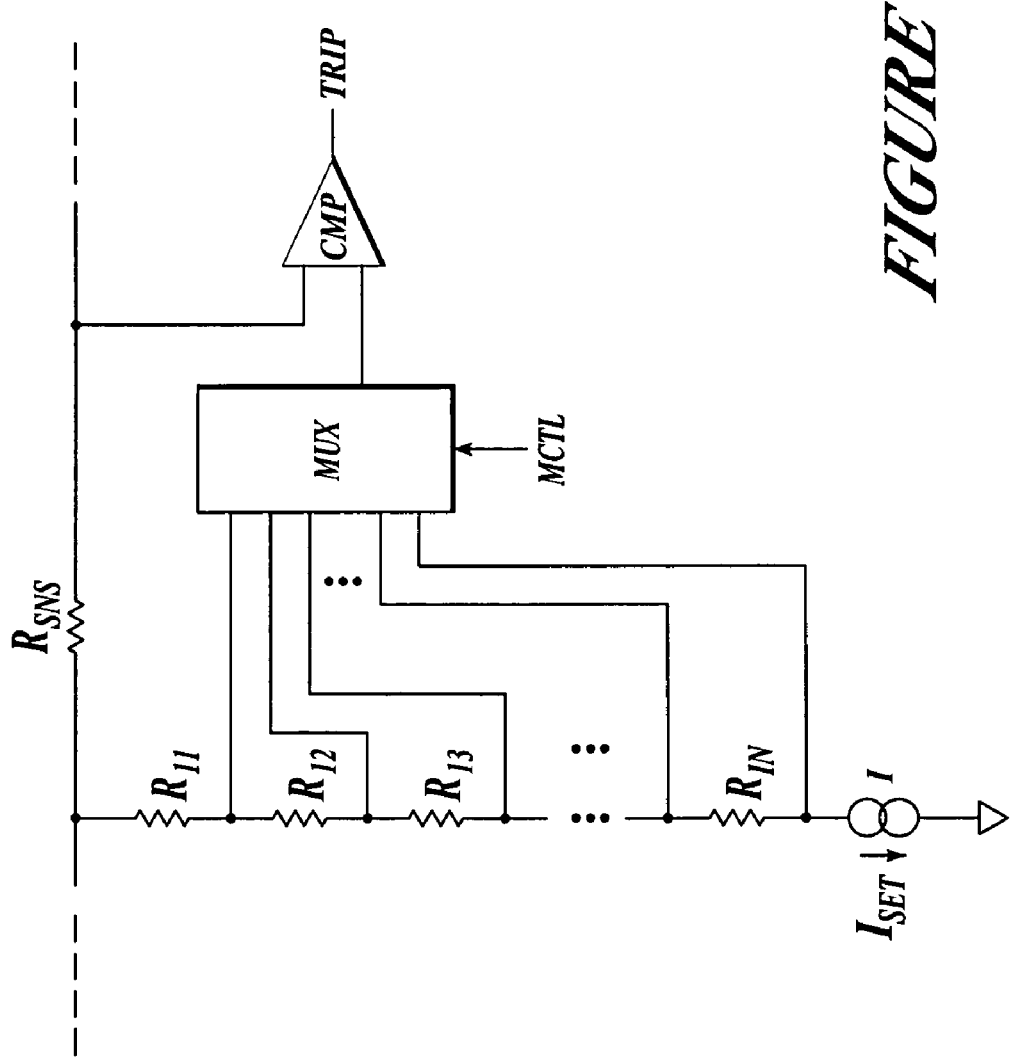
FIG. 3 is a schematic illustration of an example selection mechanism for a trip-point detection circuit.

FIG. 3 is a schematic illustration of an example selection mechanism (300) for a trip-point detection circuit that is arranged according to yet another aspect of the present invention. The selection mechanism is illustrated as a tapped resistor circuit (R11, R12, R13 . . . R1N), a current source (I), a multiplexer (MUX) circuit, and a comparator circuit (CMP).

Resistors R11–R1N are series coupled to one another between the sense resistor (RNSN) and the current source (I). Current source I is arranged to provide current ISET to the series resistors such that a voltage divider is formed with multiple tap-points. Selected tap-points are coupled to the MUX circuit. The MUX circuit is arranged to selectively couple one of the tap-points to an input of comparator circuit CMP in response to a multiplexer control signal (MCTL). The selected tap-point is arranged to adjust the effective trip-point in comparator circuit CMP such that the detection signal (TRIP) is asserted for a desired threshold level.

The selection mechanism illustrated in FIG. 3 may be used in an electronic trip-point detection circuit such as illustrated in FIGS. 1 and 2. For example, resistors R1 and R2 in FIG. 1 may be replaced with the tapped resistor circuit that is illustrated in FIG. 3.

Figure 4:
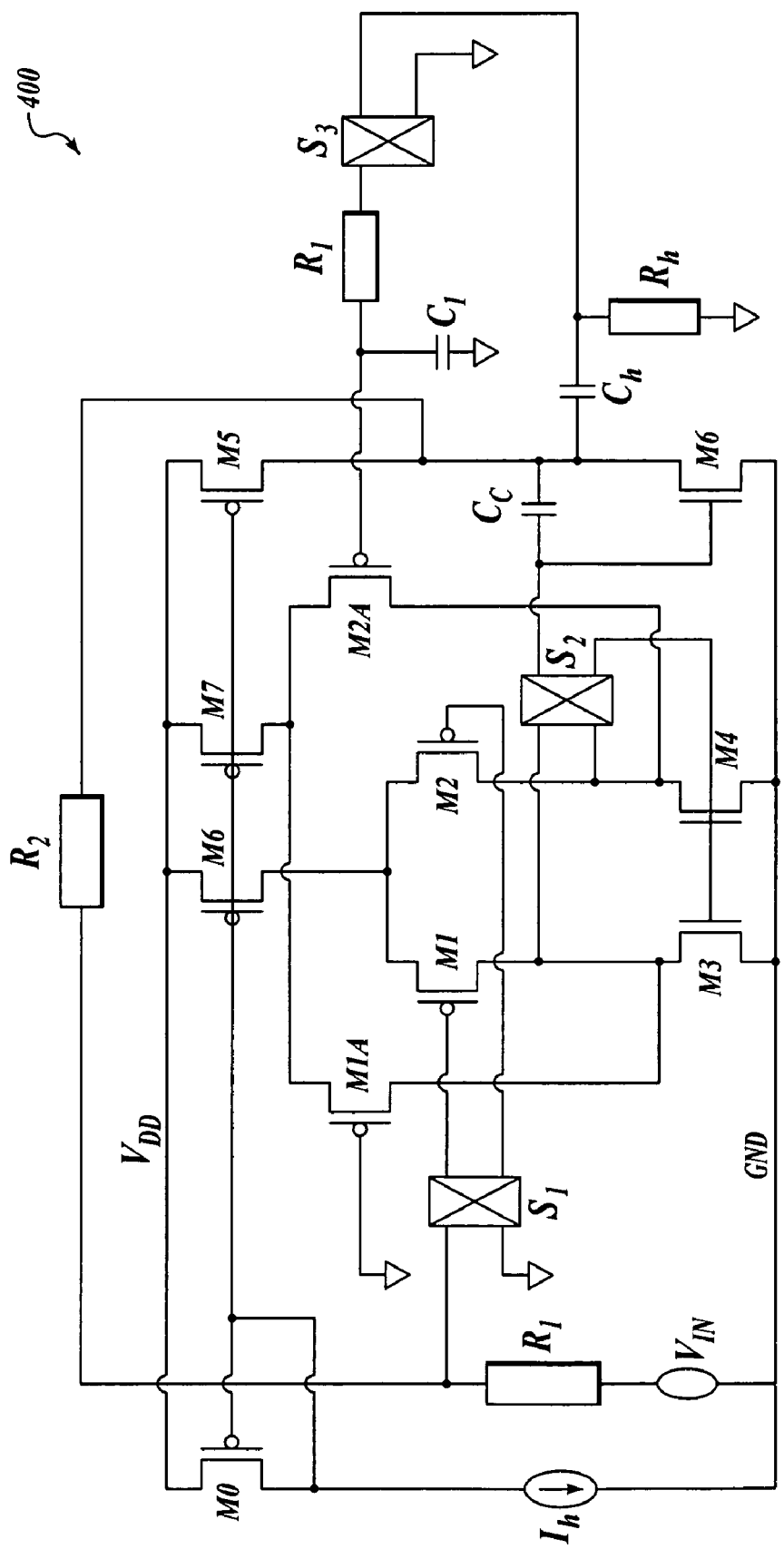
FIG. 4 is a schematic illustration of an example auto-zero comparator circuit for a trip-example detection circuit.

FIG. 4 is a schematic illustration of an example auto-zero comparator circuit (400) for still yet another example trip-detection circuit. Auto-zero comparator circuit 400 includes eleven transistors, four resistors, three capacitors, a current source, and three switching circuits (S1–S3).

Transistors M5–M7 are arranged to operate as current sources that are biased by a biasing signal that is provided by diode-connected transistor M0 and current source Ib. Transistors M1 and M2 are arranged in a differential pair configuration with transistor M6 and switching circuit S1. Transistors M3 and M4 are arranged in a current mirror configuration with switching circuit S2. Transistors M1A and M2A are arranged in a differential pair configuration with transistor M7. Transistor M6 is arranged as an inverting gain stage that is biased by transistor M5. Resistor R1 is coupled between the input signal (VIN) and resistor R2, which is also coupled to the output of the comparator. Capacitor Cc is a compensation capacitor that is coupled between the single ended output of differential pair M1/M2 and the output of the inverting gain stage. Resistor Rl and Cl are arranged as a low pass filter that is coupled between an output of switching circuit S3 and the gate of transistor M2A. Capacitor Ch and Rh form a high pass filter that is coupled between an output of the comparator and the input of switching circuit S3. The gate of transistor M1A is coupled to ground. The gate of transistor M1 and M2 are selectively coupled to the input signal (VIN) via switching circuit S1.

Switching circuit S1–S3 are operated to provide a chopper stabilized offset cancellation technique for the comparator circuit. Transistors M1A/M2A provide a chopper stabilization effect to the comparator, while transistors M1 and M2 provide the comparison functions in cooperation with switching circuit S1, which selectively isolates the inputs from the differential input pair. The high pass filter formed by Rh and Ch have a time constant that is low enough such that the modulated offset and modulated flicker noise are passed relatively un-attenuated. The low pass filter formed by Rl and Cl are configured to have a corner frequency that is above the 1/f noise corner of the operational amplifier.

Figure 5:
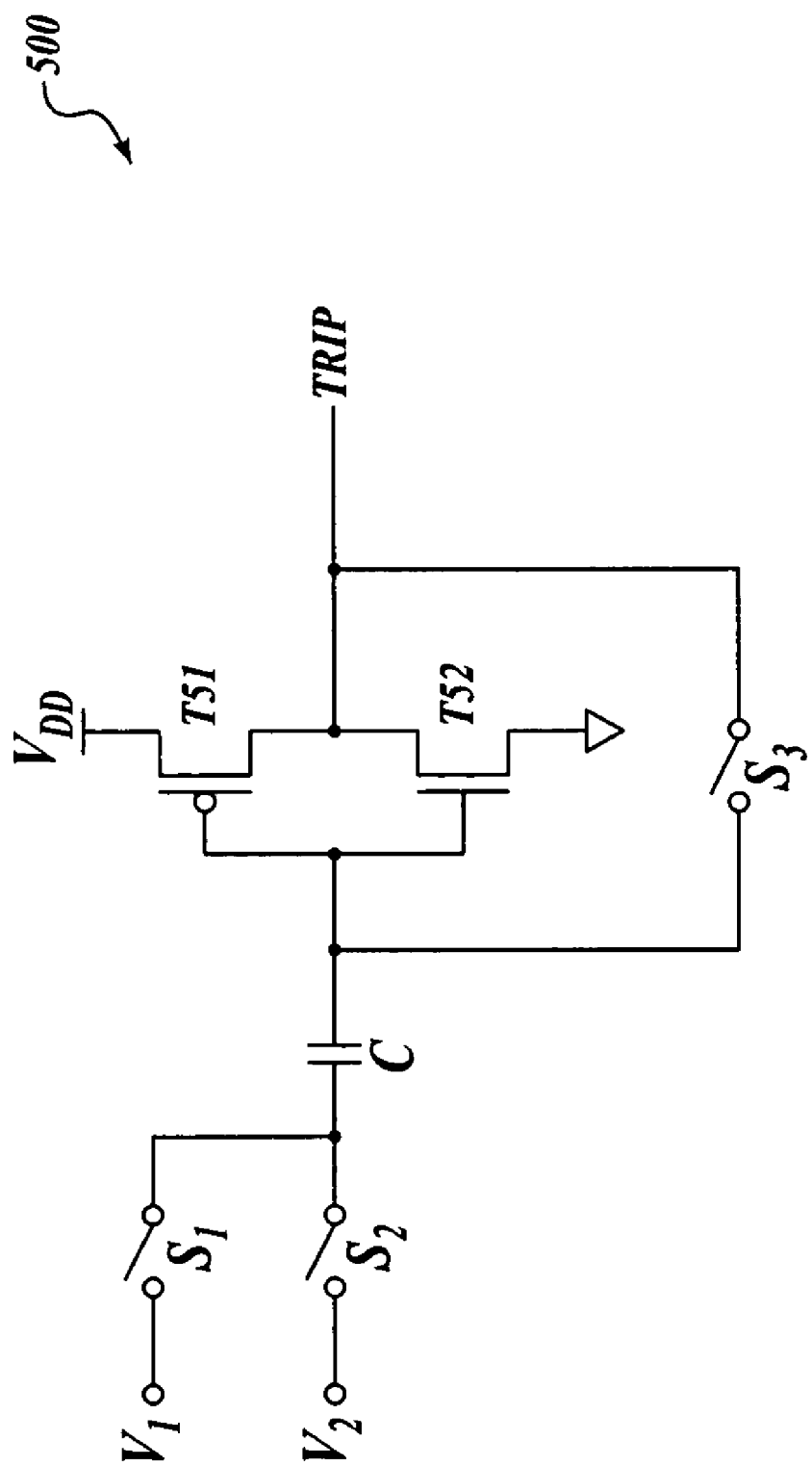
FIG. 5 is a schematic illustration of another example auto-zero comparator circuit for a trip-example detection circuit, arranged in accordance with aspects of the present invention.
Figure 6:
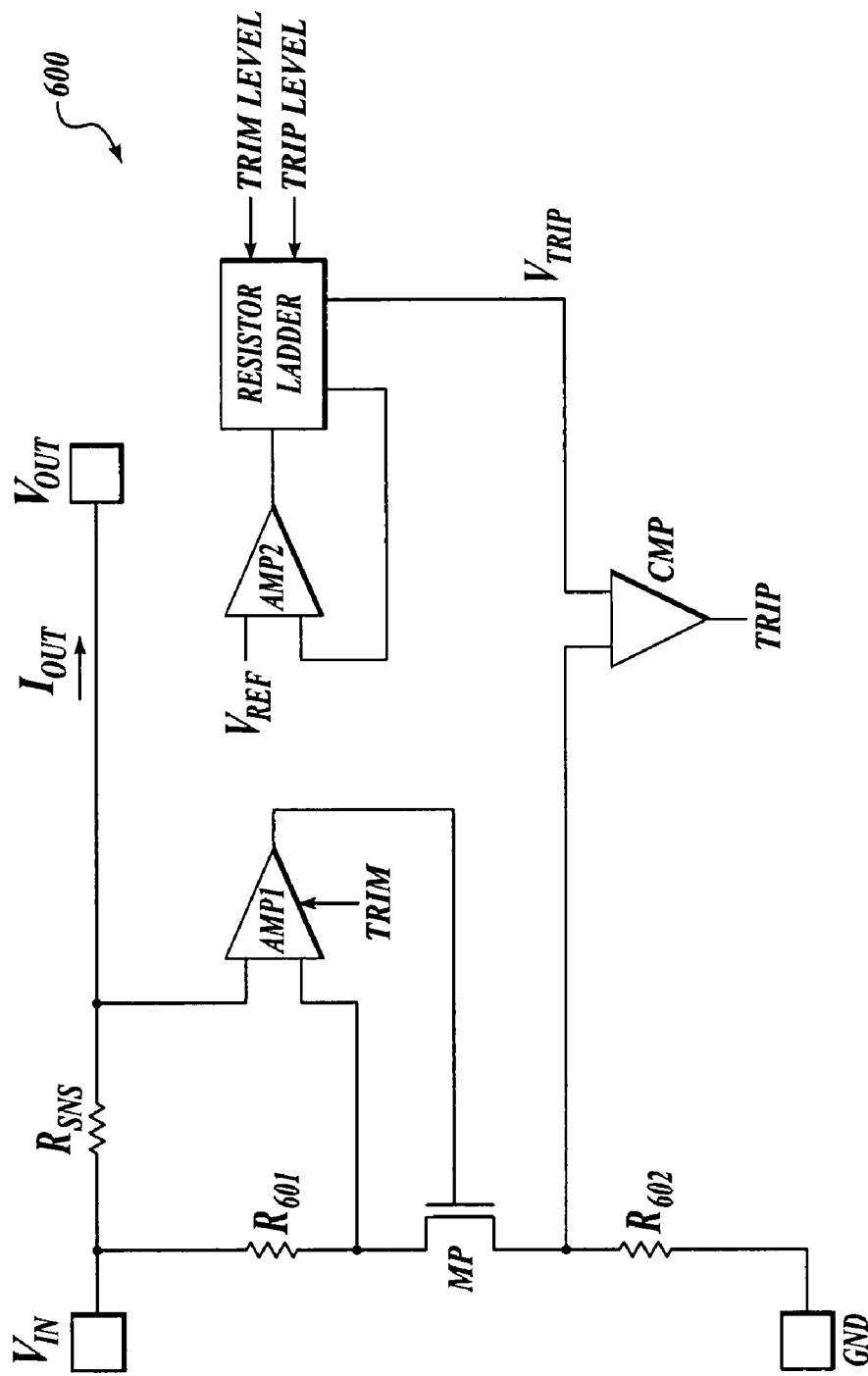
FIG. 6 is an illustration of a conventional trip-point detection circuit.

FIG. 5 is a schematic illustration of another example auto-zero comparator circuit (500) for yet another example trip-detection circuit that is arranged in accordance with aspects of the present invention. Auto-zero comparator circuit 500 includes an inverter circuit (e.g., transistors T51 and T52), three switching circuits (S1–S3), and a capacitor circuit (C).

Switching circuits S1 and S2 are arranged to selectively couple one of the input signals (V1, V2) to a first terminal of capacitor circuit C. A second terminal of capacitor circuit C is coupled to an input of the inverter circuit. The output of the inverter circuit is selectively coupled to the input of the inverter circuit via switching circuit S3.

In a first operating phase, switching circuit S1 is operated in a closed circuit position such that signal V1 is stored on a first plate that is associated with capacitor circuit C. Also in the first operating phase, the input and output of the inverter circuit are coupled together to the second plate associated with capacitor circuit C such that any offsets associated with the inverter circuit are stored on the second plate. In a second operating phase, switching circuits S1 and S3 are operated in an open circuit position and switching circuit S2 is operated in a closed circuit position. Signal V2 is coupled to the first plate of capacitor circuit C during the second operating phase such that the inverter circuit will latch in a high or low logic level based on the difference between signals V1 and V2, while compensating for the internal offsets in the inverter circuit.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for providing a trip-point detection signal when a current that is delivered to a load decreases below a predetermined threshold, the method comprising:

coupling a current (IOUT) to a common node through a pass circuit that is responsive to a first control signal such that the current (IOUT) is controlled;

coupling the current (IOUT) from the common node through a sense circuit to the load at an output node;

setting a trip-point level with a first resistor circuit and a first current source, wherein the first current source is series coupled to the common node through the first resistor circuit, and wherein the first current source is configured to provide an approximately constant current level;

monitoring a voltage associated with the load to provide a sensed output voltage comparing the trip-point level with the sensed output voltage;

asserting the trip-point detection signal when the current (IOUT) decreases from a current limit level (IMAX) to a predetermined threshold level as indicated by the change in the sensed output voltage relative to the trip point level;

selecting a tap-point in the first resistor circuit in response to a selection signal; and adjusting the trip-point level associated with trip-point detection signal in response to the selected tap-point in the first resistor circuit.

2. The method of claim 1, further comprising:

coupling a first input of an amplifier to the output node;

coupling a second input of the amplifier to the first resistor circuit and the first current source; and providing the first control signal in response to an output of the amplifier.

3. The method of claim 1, further comprising: reducing an offset that is associated with the comparison between the trip-point level and the sensed output voltage.

4. A method for providing a trip-point detection signal when a current that is delivered to a load decreases below a predetermined threshold comprising:

coupling a current (IOUT) to a common node through a pass circuit that is responsive to a first control signal such that the current (IOUT) is controlled;

coupling the current (IOUT) from the common node through a sense circuit to the load at an output node;

setting a trip-point level with a first resistor circuit and a first current source, wherein the first current source is series coupled to the common node through the first resistor circuit, and wherein the first current source is configured to provide an approximately constant current level;

monitoring a voltage associated with the load to provide a sensed output voltage comparing the trip-point level with the sensed output voltage;

asserting the trip-point detection signal when the current (IOUT) decreases from a current limit level (IMAX) to a predetermined threshold level as indicated by the change in the sensed output voltage relative to the trip point level;

coupling a first input of an amplifier to the output node;

coupling a second input of the amplifier to the first resistor circuit and the first current source;

providing the first control signal in response to an output of the amplifier coupling a first amplifier to the output node through a second resistor circuit;

coupling a second current source to the output node through the second resistor circuit; and adjusting at least one of a current level associated with the second current source and a resistance level that is associated with the second resistor circuit in response to the sensed output voltage.

5. An apparatus for providing a trip-point detection signal when a current that is delivered to a load decreases below a predetermined threshold, the apparatus comprising:

a first current source that is arranged to provide a first current, wherein the first current has a first level that is approximately constant, and wherein the first current source is controlled;

a first resistor circuit that is coupled between a common node and the first current source, wherein the first resistor circuit has an associated tap-point, wherein the first resistor circuit comprises at least a first resistor and a second resistor that are coupled together at the tap point;

a pass circuit that is coupled between an input source node and the common node;

a sense circuit that is coupled between the common node and an output node;

a comparator circuit that includes a first input that is coupled to the tap-point in the first resistor circuit, a second input that is coupled to the output node, and an output node that indicates the trip-point detection signal when the current (IOUT) decreases from a current limit level (IMAX) to a predetermined threshold level.

6. The apparatus of claim 5, wherein the comparator circuit comprises at least one of: a chopper stabilized comparator, a low-offset comparator, and an auto-zero comparator.

7. The apparatus of claim 5, further comprising: an amplifier that includes a first input that is coupled to the output node, a second input that is coupled to the first resistor circuit and the first current source, wherein the amplifier is arranged such that the first current from the first current source is responsive to an output of the amplifier.

8. The apparatus of claim 7, further comprising: a second resistor circuit and a second current source, wherein the second current source is coupled to the output node through the second resistor circuit, and wherein the first input of the amplifier is coupled to the output node through the second resistor circuit.

9. The apparatus of claim 8, further comprising a second amplifier circuit that includes a first input that is coupled to the output node, a second input that is coupled to a reference signal, and wherein the second current source is controlled in response to an output of the second amplifier circuit.

10. The apparatus of claim 8, further comprising a second amplifier circuit that includes a first input that is coupled to the output node, a second input that is coupled to a reference signal, and wherein the second resistance circuit is controlled in response to an output of the second amplifier circuit.

11. The apparatus of claim 10, further comprising a feedback circuit, wherein the first input of the second amplifier circuit is coupled to the output node through the feedback circuit.

12. The apparatus of claim 10, further comprising a feedback circuit, wherein the first input of the second amplifier circuit is coupled to the output node through the feedback circuit, and wherein the feedback circuit corresponds to at least one of: an active scaling circuit, a passive scaling circuit, a voltage divider circuit, a resistor divider circuit, a diode divider circuit, and a capacitor divider circuit.

13. The apparatus of claim 5, wherein the first resistor circuit comprises: a multiplexer and a tapped resistor circuit, wherein the multiplexer includes inputs that are coupled to common points in the tapped resistor circuit, and wherein the multiplexer is responsive to a selection signal such that one of the common points is selected as the tap point that is associated with the first resistor circuit.

14. An apparatus for providing a trip-point detection signal when a current that is delivered to a load decreases below a predetermined threshold, the apparatus comprising:
a first voltage drop means that is coupled to a common node and arranged to provide a trip-point level at a tap-point, wherein the first voltage drop means comprises:
a resistor means that comprises at least a first resistance means and a second resistance means that are coupled together at the tap point; and
a current source means that is arranged to couple a sense current to the resistor means such that the trip point level is provided at the tap point in response to the sense current;
a pass means that is coupled between an input source node and the common node;
a sense means that is coupled between the common node and an output node;
a comparator means that includes a first input that is coupled to the tap-point, a second input that is coupled to the output node, wherein the comparison means is arranged to assert the trip-point detection signal when the current (IOUT) decreases from a current limit level (IMAX) to a predetermined threshold level.

15. The apparatus of claim 14, wherein the current source means is arranged to provide an approximately constant current.

16. The apparatus of claim 14, further comprising a selector means, wherein the resistor means comprises a series of resistors with a series of common points, and wherein the selector means is arranged to select one of the common points as the tap-point.

17. The apparatus of claim 14, wherein the sense means comprises a resistor means that is series coupled between the common node and the output node.

18. The apparatus of claim 14, wherein the pass means comprises a field effect device that is controlled in constant voltage and constant current modes with respect to the load.

19. The apparatus of claim 14, wherein the comparator means comprises at least one of: a chopper stabilized comparator, a low-offset comparator, and an auto-zero comparator.

20. An apparatus for providing a trip-point detection signal when a current that is delivered to a load decreases below a predetermined threshold, the apparatus comprising:
a first current source that is arranged to provide a first current to a first sense node, wherein the first current has a first level that is approximately constant, and wherein the first current source is controlled;
a first resistor circuit that is coupled between a common node and a tap-point;
a second resistor circuit that is coupled between the tap-point and the first sense node;
a pass circuit that is coupled between an input source node and the common node;
a sense circuit that is coupled between the common node and an output node;
a comparator circuit that includes a first input that is coupled to the tap-point, a second input that is coupled to the output node, and an output that indicates the trip-point detection signal when the current (IOUT) decreases from a current limit level (IMAX) to a predetermined threshold level;
a third resistor circuit that is coupled between the output node and a second sense node;
a second current source that is arranged to provide a second current to the second sense node, wherein the second current source is controlled in response to changes in a voltage associated with the output node; and
an amplifier circuit that is arranged to provide a variable control signal for the pass circuit, wherein the amplifier circuit has a first input that is coupled to the first sense node, and a second input that is coupled to the second sense node.

21. The apparatus of claim 20, further comprising:
a fourth resistor circuit that is coupled between the output node and a third sense node;
a fifth resistor circuit that is coupled to the third sense node;
a second amplifier circuit that is arranged to provide a second variable control signal for the second current source, wherein the second amplifier circuit has a first input that is coupled to a reference signal, and a second input that is coupled to the third sense node.

* * * * *

UNITED STATES PATENT AND TRADEMARK OFFICE
CERTIFICATE OF CORRECTION

| | | |
|---|---|---|
| PATENT NO. | : 7,102,415 B1 | Page 1 of 1 |
| APPLICATION NO. | : 10/810120 | |
| DATED | : September 5, 2006 | |
| INVENTOR(S) | : Vladislav Potanin et al. | |

It is certified that error appears in the above-identified patent and that said Letters Patent is hereby corrected as shown below:

Colum 6, Line 15: "Transistors MIA" should read --Transistors M1A --

Column 6, Line 28: "transistor MIA" should read -- transistor M1A--

Signed and Sealed this

Sixth Day of March, 2007

JON W. DUDAS
*Director of the United States Patent and Trademark Office*